US009804230B2

(12) United States Patent
Akaishi et al.

(10) Patent No.: US 9,804,230 B2
(45) Date of Patent: Oct. 31, 2017

(54) BATTERY DEGRADATION DETECTION DEVICE

(71) Applicant: TOYOTA JIDOSHA KABUSHIKI KAISHA, Toyota-shi, Aichi-ken (JP)

(72) Inventors: Takayuki Akaishi, Toyota (JP); Yasuomi Takeuchi, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 14/895,106

(22) PCT Filed: May 28, 2014

(86) PCT No.: PCT/IB2014/000889
§ 371 (c)(1),
(2) Date: Dec. 1, 2015

(87) PCT Pub. No.: WO2014/195776
PCT Pub. Date: Dec. 11, 2014

(65) Prior Publication Data
US 2016/0124053 A1 May 5, 2016

(30) Foreign Application Priority Data

Jun. 4, 2013 (JP) .................................. 2013-117810

(51) Int. Cl.
*G01R 31/36* (2006.01)
*G07C 5/08* (2006.01)
*G01R 31/00* (2006.01)

(52) U.S. Cl.
CPC ..... *G01R 31/3679* (2013.01); *G01R 31/3689* (2013.01); *G07C 5/0841* (2013.01); *G01R 31/007* (2013.01)

(58) Field of Classification Search
CPC ............ G01R 31/3679; G01R 31/3689; G01R 31/007; G07C 5/0841
See application file for complete search history.

(56) References Cited

U.S. PATENT DOCUMENTS 6,828,914 B2 * 12/2004 Zur .................... G01R 31/3644
324/433

FOREIGN PATENT DOCUMENTS

JP      10-070843 A      3/1998
JP      2002-365347 A    12/2002
(Continued)

*Primary Examiner* — Mussa A Shaawat
*Assistant Examiner* — Michael Kerrigan
(74) *Attorney, Agent, or Firm* — Sughrue Mion, PLLC

(57) ABSTRACT

Provided is a battery degradation detection device that detects the degradation state of a battery installed on a vehicle. The battery degradation detection device includes: a flag setting unit that sets, each time the vehicle is started, a flag indicating a sign of degradation of the battery on the basis of a voltage value of the battery at the start of the vehicle; a flag storage unit that stores the flag; a sign-of-degradation determination unit that determines whether or not the battery shows a sign of degradation on the basis of the number of times the flag has been stored in the past; and a degradation determination unit that determines whether or not the battery is in a degradation state on the basis of the voltage value of the battery when it is determined by the sign-of-degradation determination unit that the battery shows a sign of degradation.

8 Claims, 10 Drawing Sheets

(56) References Cited

FOREIGN PATENT DOCUMENTS

| | | |
|---|---|---|
| JP | 2003-129927 A | 5/2003 |
| JP | 2006-174619 A | 6/2006 |
| JP | 2007-060791 A | 3/2007 |
| JP | 2008-126812 A | 6/2008 |
| JP | 2010-102869 A | 5/2010 |
| JP | 2010-164510 A | 7/2010 |
| JP | 2011-017546 A | 1/2011 |
| JP | 2011-099691 A | 5/2011 |
| JP | 2011-189788 A | 9/2011 |
| JP | 2011-257226 A | 12/2011 |
| JP | 2014-156170 A | 8/2014 |
| WO | 2014/125349 A2 | 8/2014 |

* cited by examiner

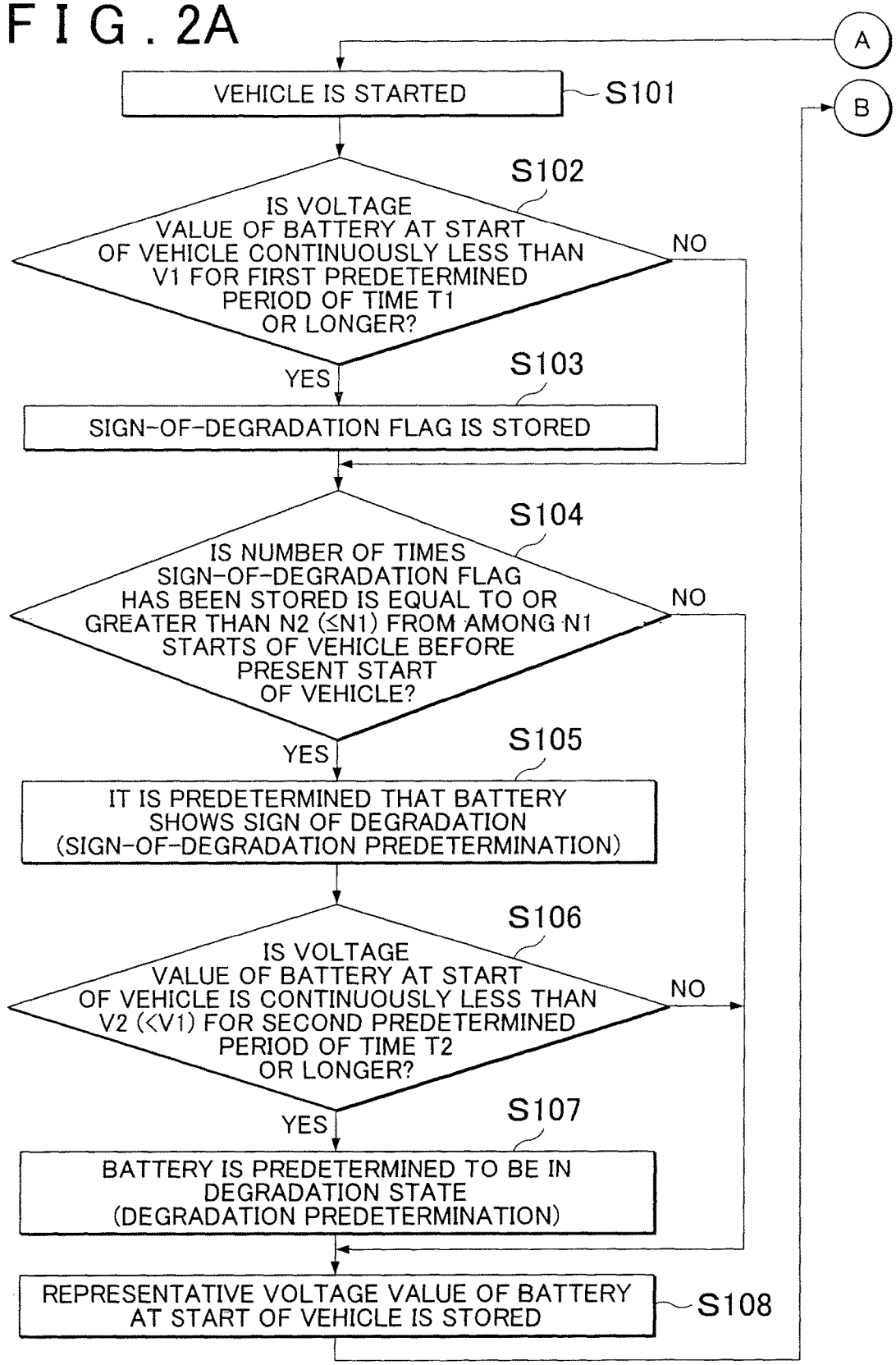

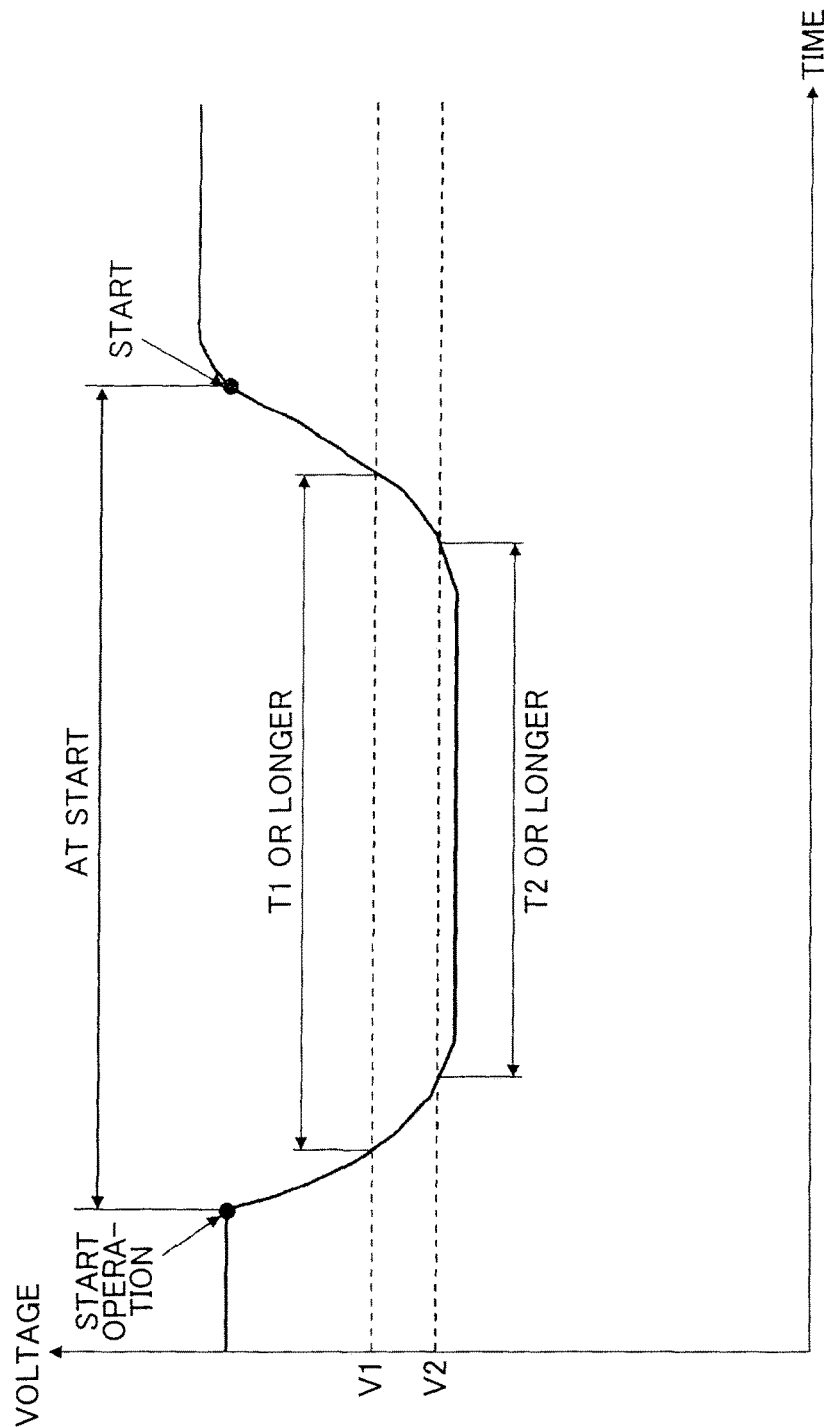

FIG. 7

| NUMBER OF STARTS | −N3 TIMES | ... | −2 TIMES | −1 TIME | PRESENT |
|---|---|---|---|---|---|
| REPRESENTATIVE VOLTAGE VALUE | 9.8V | ... | 9.5V | 9.6V | 10.5V |
| AVERAGE OF REPRESENTATIVE VOLTAGE VALUES | 9.9V | ... | 9.8V | 9.7V | — |

COMPARISON

BATTERY DEGRADATION DETECTION DEVICE

BACKGROUND OF THE INVENTION

1. Field of the Invention

The invention relates to a technique for detecting a battery degradation.

2. Description of Related Art

A technique for detecting the state of a battery is available (for example, Japanese Patent Application Publication No 2002-365347 (JP 2002-365347 A)).

In JP 2002-365347 A, a technique for detecting a state of charge (SOC; charging ratio) of a battery is disclosed as a technique for detecting the charging state of a battery.

Since battery degradation advances with time due to repeated charging and discharging of the battery, it is necessary to replace the battery with advanced degradation before the vehicle carrying the battery fails to start. The voltage value of a battery is generally decreases in the course of degradation. Accordingly, the degradation state of a battery is detected, for example, on the basis of the decrease in the voltage value of the battery by detecting the voltage value of the battery in a predetermined state and determining whether or not the voltage value has decreased to or below a predetermined value.

However, the voltage value of a battery typically also changes with the SOC of the battery, and the voltage of the battery drops rapidly when the SOC decreases to or below a predetermined ratio. Further, over a fixed period of time immediately after the charging, a battery demonstrates a voltage value that is higher than usual due to activation of chemical reactions inside the battery (charging polarization). For this reason, when the degradation state of a battery is detected on the basis of the decrease in the voltage value of the battery, a battery in which the SOC is equal to or less than a predetermined ratio can be erroneously detected as degraded, although practically no degradation has advanced in the battery. It is also possible that a battery immediately after the charging would be erroneously detected as having practically no degradation, although the degradation has advanced to a comparatively high level. The resultant problem is that the battery is used without replacement and the vehicle carrying the battery can fail to start.

SUMMARY OF THE INVENTION

The invention provides a battery degradation detection device that can accurately detect the degradation state of a battery.

An aspect of the invention relates to a battery degradation detection device that detects a degradation state of a battery installed on a vehicle, the battery degradation detection device including: a flag setting unit that sets, each time the vehicle is started, a flag indicating a sign of degradation of the battery on the basis of a voltage value of the battery at a start of the vehicle; a flag storage unit that stores the flag; a sign-of-degradation determination unit that determines whether or not the battery shows a sign of degradation on the basis of the number of times the flag has been stored in the past; and a degradation determination unit that determines whether or not the battery is in a degradation state on the basis of the voltage value of the battery when it is determined by the sign-of-degradation determination unit that the battery shows a sign of degradation.

According to this aspect, it is possible to provide a battery degradation detection device that can accurately detect the degradation state of a battery.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 2A and FIG. 2B are flowcharts of battery degradation detection processing performed by the battery degradation detection device 30 (battery electronic control unit (ECU) 34) of the present embodiment;

FIG. 3 explains a change in the voltage value of a battery 31 in relation to the time elapsed at the start of the vehicle 1;

FIG. 7 explains a method for determining the charging polarization of the battery 31 with the battery degradation detection device 30 (battery ECU 34) of the present embodiment.

DETAILED DESCRIPTION OF EMBODIMENTS

An embodiment of the invention will be explained below with reference to the appended drawings.

Figure 1A:
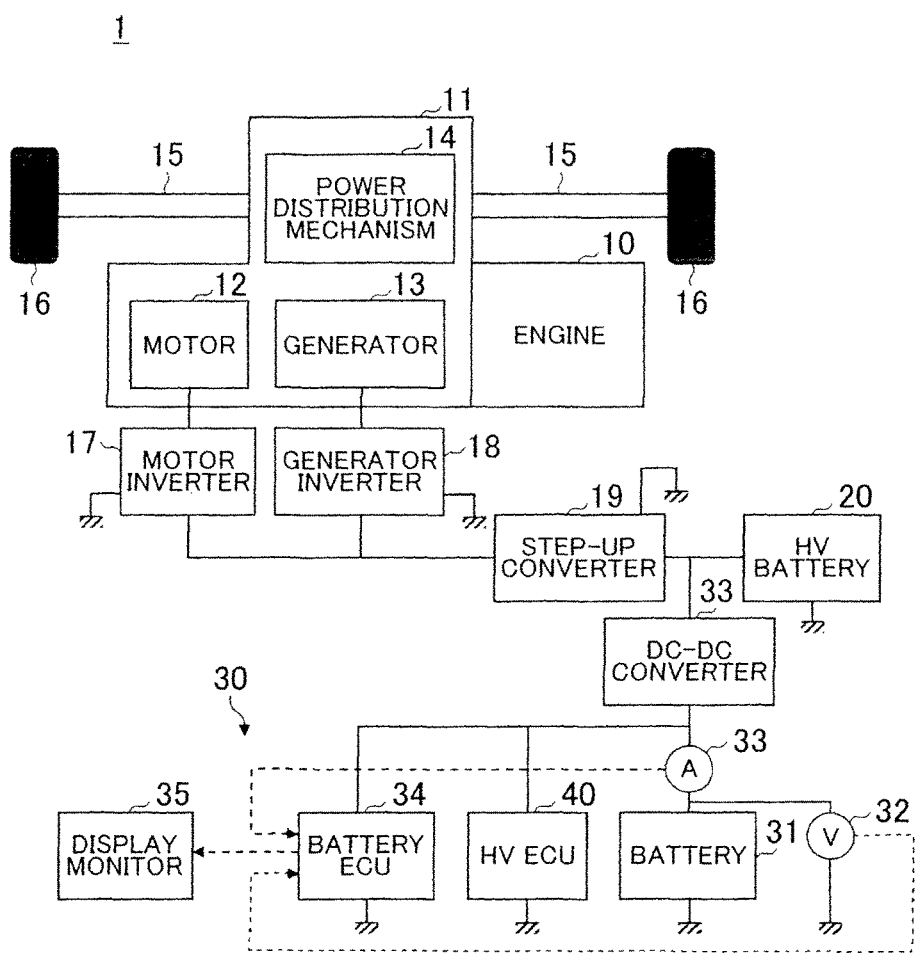
FIG. 1A is a block diagram showing the configuration of a vehicle 1 equipped with a battery degradation detection device 30 of the present embodiment.
Figure 1B:
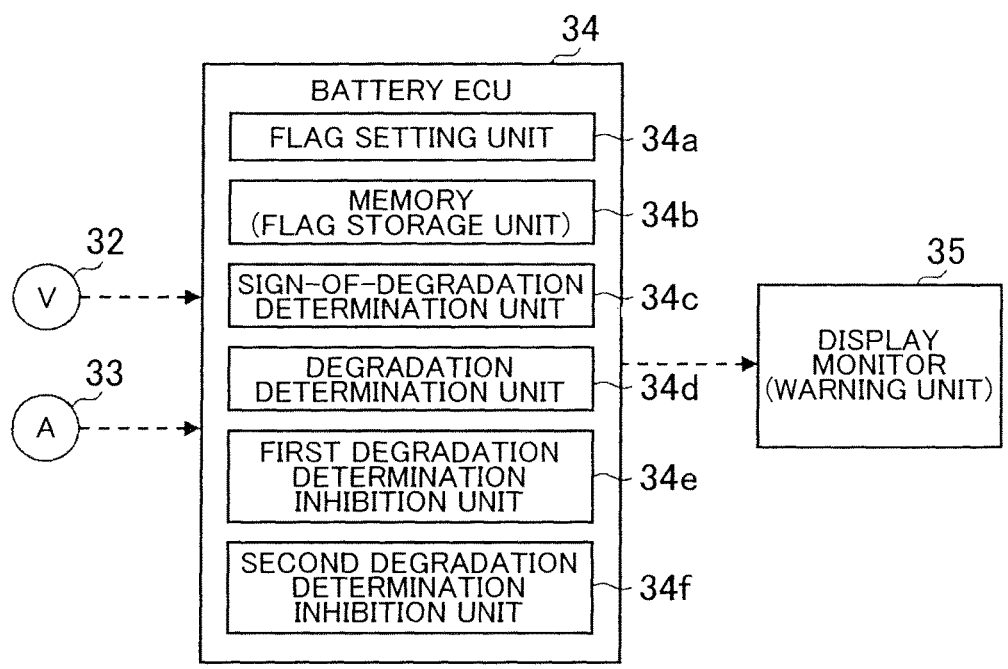
FIG. 1B is a block diagram showing the configuration of the battery degradation detection device 30 of the present embodiment.

FIG. 1A is a block diagram showing the configuration of the vehicle 1 equipped with the battery degradation detection device 30 of the present embodiment. FIG. 1B is a block diagram showing the configuration of the battery degradation detection device 30. The solid lines between the components show a power supply system, and the broken lines show an information transmission system (for example, a system for transmitting control command signals and sensor output signals).

Referring to FIG. 1A, the vehicle 1 in the present embodiment is a hybrid vehicle and has an engine 10 and a motor 12. The drive power of at least either of the engine 10 and the motor 12 is merged by a power distribution mechanism 14 and transmitted by a differential mechanism (not shown in the figure) and a drive shaft 15 to connected drive wheels 16, and this power is used to run the vehicle 1. The vehicle 1 of the present embodiment is configured as a front-engine front-wheel-drive vehicle (FF vehicle) or a rear-engine rear-wheel-drive vehicle (RR vehicle), but such a configuration is not limiting and the vehicle may be also, for example, of a front-engine rear-drive vehicle (FR vehicle). Further, the vehicle 1 of the present embodiment is the so-called series-parallel hybrid vehicle, but this configuration is not limiting, and the vehicle may be, for example, a series hybrid vehicle or a parallel hybrid vehicle.

The vehicle 1 also has a generator (power generator) 13 which is operated by the output of the engine 10 which is allocated by the power distribution mechanism 14 for power generation. The power generated by the generator 13 is converted into direct current (DC) by a generator inverter 18 and is used for charging a hybrid vehicle (HV) battery 20 or directly for driving the motor 12. The motor 12, the generator 13, and the power distribution mechanism 14 may be configured as part of a hybrid drive device 11.

As mentioned hereinabove, the motor 12 outputs drive power for running the vehicle 1 by using the power supplied from the HV battery 20 or the like. When the vehicle is decelerated, that is, the depression of the accelerator pedal is released, the motor 12 is driven from the drive wheel 16 side through the drive shaft 15 and the power distribution mechanism 14, and the motor 12 operates as a generator, thereby performing regeneration power generation. As a result of regeneration power generation, the kinetic energy of the vehicle 1 is converted into the electric energy, and because of such conversion, a regenerative brake force acts upon the vehicle 1. The power generated by the motor 12 is converted into DC by a motor inverter 17 and used to charge the HV battery 20.

The HV battery 20 is connected (in parallel) to the motor 12 through a step-up converter 19 and the motor inverter 17. The HV battery 20 actuates the motor 12 by supplying the power to the motor 12. Further, the HV battery 20 is charged by the regenerated power generated when the motor 12 operates as a generator.

The HV battery 20 is also connected (in parallel) to the generator through the step-up converter and the generator inverter 18. The HV battery 20 is charged by the power generated by the generator 13.

The voltage of the HV battery 20 is, for example, about 300 V, and when the power is supplied from the HV battery 20 to the motor 12, the step-up converter 19 boosts the DC voltage of about 300 V, for example, to about 600 V. When the HV battery 20 is charged, the step-up converter 19 lowers the DC power of about 600 V, for example, to about 300 V. The HV battery may be any secondary battery, for example, a lithium ion battery or a nickel hydride battery.

The HV battery 20 also supplies power to the below-described battery 31 through a direct current-direct current (DC-DC) converter 21, and the battery 31 is charged by this power. The battery 31 has a voltage of about 12 V, and the DC-DC converter 21 lowers the DC voltage of about 300 V, which is supplied from the HV battery 20, for example, to about 12 V.

The vehicle 1 is also provided with a 12 V system including a battery degradation detection device 30, the battery 31, and a hybrid vehicle electronic control unit (HVECU) 40.

The battery 31 is a lead storage battery. The battery 31 supplies electric power to a load of the 12 V system, such as the below-described battery ECU 34, HVECU 40, and display monitor 35. As indicated hereinabove, the electric power is supplied to the battery 31 by the HV battery 20 through the DC-DC converter 21. The battery 31 may be also charged by supplying the regenerated power of the motor 12 or the power generated by the generator 13 to the battery 31 through the step-up converter 19 and the DC-DC converter 21.

The HVECU 40 is a control device that performs integrated control of the running state of the vehicle 1, which is a hybrid vehicle. The HVECU 40 issues a control command to an engine ECU (not shown in the figure), which is a lower-level control device that controls the engine 10, and a motor generator electronic control unit (MGECU) (not shown in the figure) that controls the motor 12 and/or the generator 13 according to the accelerator depression operation and shift operation performed by the driver. In response to a start command (for example, a start operation performed by the driver of the vehicle 1) of the vehicle 1, the battery 31 starts supplying the electric power to the HVECU 40, and the vehicle 1 is started when the HVECU 40 is energized. The start of the vehicle 1, as referred to herein, means that the vehicle 1 assumes a state in which the vehicle 1 can run, regardless of whether or not the engine 10 is started.

The battery degradation detection device 30 detects the degradation state of the battery 31. As will be described hereinbelow in greater details, the battery degradation detection device 30 determines whether or not the battery 31 is in a degradation state on the basis of the voltage value of the battery 31 at the start of the vehicle 1.

The battery degradation detection device 30 includes the battery 31, a voltage sensor 32, a current sensor 33, the battery ECU (a flag setting unit, a flag storage unit, a sign-of-degradation determination unit, a degradation determination unit, a first degradation determination inhibition unit, and a second degradation determination inhibition unit) 34, and a display monitor (warning unit) 35.

The voltage sensor 32 is a voltage detection device detecting the voltage of the battery 31.

The current sensor 33 is a current detection device detecting the current of the battery 31.

The battery ECU 34 is a processing device that performs the specific processing of detecting the degradation state of the battery 31. The battery ECU 34 includes a central processing unit (CPU) executing a program of performing the processing of various type for detecting the degradation state of the battery 31, a read only memory (ROM) storing the program, a random access memory (RAM) temporarily storing data, and a memory 34b (flag storage unit) that stores the processing results and input data as a record. In the battery ECU 34, a flag setting unit 34a, a sign-of-degradation determination unit 34c, a degradation determination unit 34d, a first degradation determination inhibition unit 34e, and a second degradation determination inhibition unit 34f are configured by executing various programs with the CPU. The memory 34b may be any nonvolatile storage device. The memory 34b may be also provided outside the battery ECU 34.

The display monitor 35 is any display device and may be a monitor also functioning as an operation unit such as a liquid crystal display (LCD) touch panel. The display monitor 35 may be a dedicated monitor for issuing a warning relating to the degradation state of the battery 31, which is described hereinbelow. Alternatively, a monitor, for example, included in the car navigation device (not shown in the figure) of the vehicle 1, may be also used as the display monitor.

Referring to FIG. 1B, the output signals from the voltage sensor 32 and the current sensor 33 are inputted to the battery ECU 34. The output signals from the voltage sensor 32 and the current sensor 33 are inputted to the battery ECU 34 with a predetermined sampling period.

The battery ECU 34 determines whether or not the below-described sign of degradation is shown by the battery 31 (sign-of-degradation determination) or determines whether or not the battery 31 is in a degradation state (degradation determination) on the basis of the voltage value of the battery 31 inputted from the voltage sensor 32 and the current value of the battery 31 inputted from the current sensor 33. The specific sign-of-degradation determination and degradation determination are described below in greater detail.

The battery ECU 34 outputs to the display monitor 35 an image signal for displaying the results of sign-of-degradation determination and degradation determination as images. For example, the display monitor 35 indicates that the battery 31 is in the degradation state to warn the driver or the like of the vehicle 1.

The degradation detection processing of the battery 31 performed by the battery degradation detection device 30 of the present embodiment is explained below.

Figure 2B:
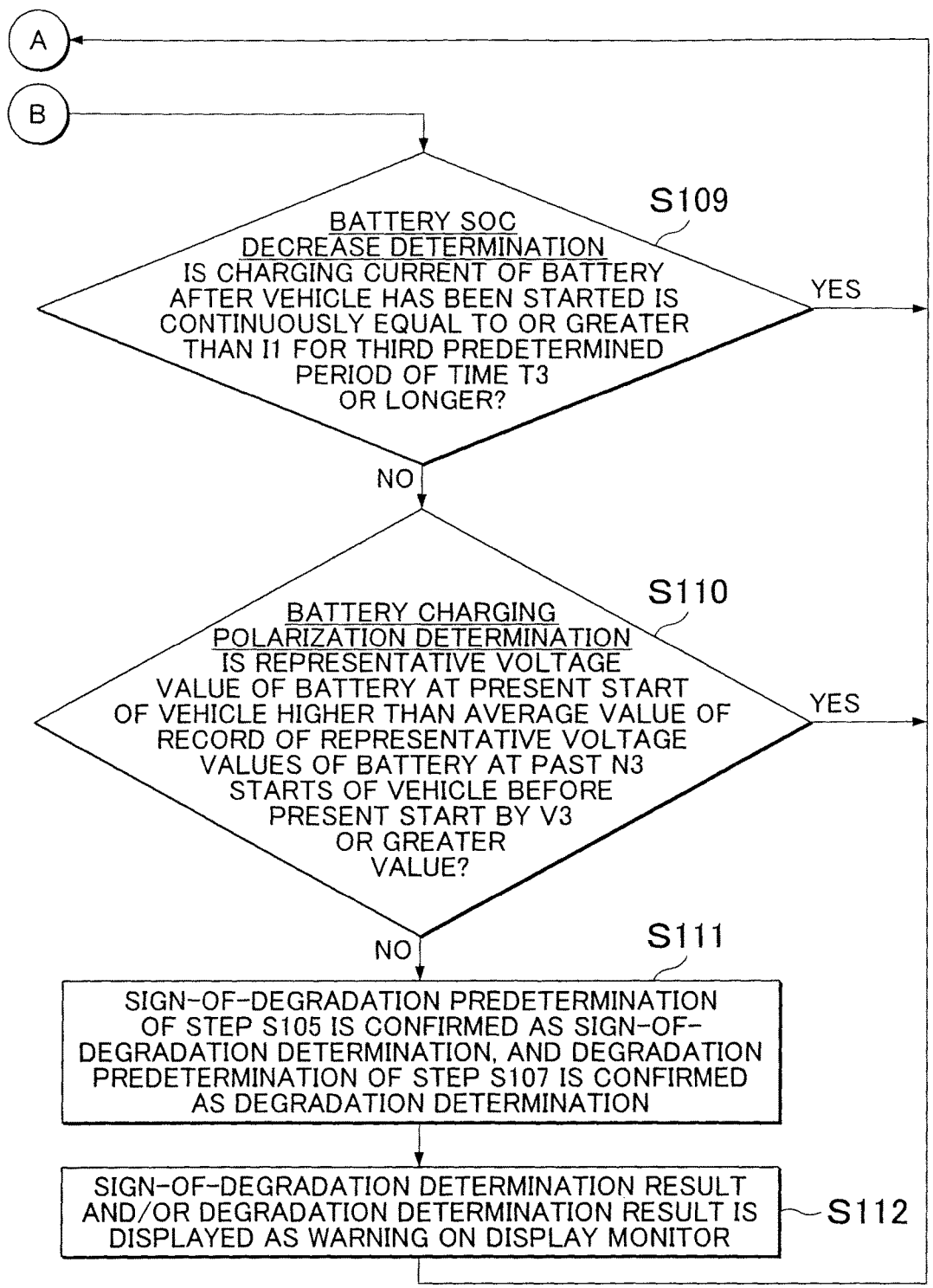

FIG. 2A and FIG. 2B are flowcharts of battery degradation detection processing performed by the battery degradation detection device 30 (battery ECU 34) of the present embodiment.

Referring to FIG. 2A and FIG. 2B, the processing flow is started at the start of the vehicle 1 in step S101.

In step S102, the flag setting unit 34a of the battery ECU 34 initially determines whether or not the voltage value of the battery 31 at the start of the vehicle 1 is continuously less than a first predetermined voltage value (V1) for a first predetermined period of time (T1) or longer. The expression "at the start of the vehicle 1" used herein means a period of time from the start to the end of the start operation. The start operation may be an operation performed by the driver of the vehicle 1, for example, by pressing a start button, or an automatic operation performed on the basis of a command signal or the like from some control device or the like located inside or outside the vehicle 1.

A change in the voltage value of a battery 31 in relation to the time elapsed at the start of the vehicle 1 is explained below with reference to FIG. 3. FIG. 3 shows an example of the change in the voltage value of the battery 31 at the start of the vehicle 1; in the figure, the voltage value of the battery 31 is plotted against the ordinate and time is plotted against the abscissa. Referring to FIG. 3, typically where the start operation is performed, power supply from the battery 31 to the HVECU 40 is started, as mentioned hereinabove, and a comparatively large current that energizes the HVECU 40 is discharged from the battery 31, whereby the voltage value of the battery 31 is decreased. The voltage value of the battery 31 changes by decreasing after the start operation, drifting at a certain decreased voltage value, and returning to the original voltage value at the end of the start operation of the vehicle 1. As the degradation of the battery 31 advances, the voltage value at the start of the vehicle 1 tends to decrease. Therefore, in step S102, V1 is set as a threshold voltage value indicating the sign of degradation of the battery 31, and the sign of degradation of the battery 31 is detected on the basis of V1. The voltage value at the start of the vehicle 1 can also temporarily decrease below V1, then drift at a value above V1, and return to the original voltage value at the end of the start operation, irrespective of the degradation of the battery 31. For this reason, the sign of degradation is detected by determining whether or not the voltage value of the battery 31 at the start of the vehicle 1 is continuously less than V1 for a period of time T1 or longer, as shown in FIG. 3. The sign of degradation may be also detected in a simple manner by whether or not the voltage value of the battery 31 is less than V1. A threshold voltage value V11, which is lower than V1 may be set and the sign of degradation may be detected by whether or not the voltage value of the battery 31 is below V11 in order to prevent the detection of the case in which the voltage value of the battery 31 is temporarily below V1.

When the determination condition is fulfilled in step S102, the processing advances to step S103, the flag setting unit 34a sets a sign-of-degradation flag indicating the sign of degradation of the battery 31, the memory (flag storage unit) 34b located in the battery ECU 34 stores the sign-of-degradation flag, and the processing advances to step S104. Where the determination condition is not fulfilled in step S102, the processing advances to step S104.

Then, in step S104, the sign-of-degradation determination unit 34c of the battery ECU 34 determines whether or not the number of times the sign-of-degradation flag has been stored is equal to or greater than a second predetermined number of times (N2), from among a first predetermined number (N1) of starts of the vehicle 1 before the present start of the vehicle 1. Here, N1 is a natural number (excluding 0), and N2 is a natural number (excluding 0) that is equal to or less than N1.

Where the determination condition is fulfilled in step S104, the processing advances to step S105, the sign-of-degradation determination unit 34c predetermines (sign-of-degradation predetermination) that the battery 31 shows a sign of degradation, and the processing advances to step S106. Since the predetermination of a sign of degradation is thus performed on the basis of not only the detection of the sign of degradation associated with the present start of the vehicle 1, but also on the basis of the number of times (a plurality of times) the sign-of-degradation flag has been stored in the past, it is possible to prevent erroneous detection such as accidental detection of a sign of degradation which has occurred for some reason or other. Where the determination condition is not fulfilled in step S104, the processing advances to step S108. For example, the determination condition of step S104 may be set to whether or not the number of times the sign-of-degradation flag has been stored in the past has reached a predetermined number of times.

Then, in step S106, the degradation determination unit 34d of the battery ECU 34 determines whether or not the voltage value of the battery 31 at the start of the vehicle 1 is continuously less than a second predetermined voltage value (V2), which is lower than V1, for a second predetermined period of time (T2) or longer. Referring to FIG. 3, V2, which is lower than V1, is set as a threshold voltage value indicating the degradation state, in the same manner as the threshold voltage value indicating the above-described sign of degradation, and the degradation state is detected by whether or not the voltage value of the battery 31 at the start of the vehicle 1 is continuously less than V2 for T2 or longer. The degradation state may be also detected in a simple manner by whether or not the voltage value of the battery 31 is below V2. Further, a, threshold voltage value V21 lower than V2 may be set and the degradation state may be detected by whether or not the voltage value of the battery 31 is below V21 in order to prevent the detection of the case in which the voltage value of the battery 31 is temporarily below V2.

Where the determination condition is fulfilled in step S106, the processing advances to step S107, the degradation determination unit 34d predetermines (degradation predetermination) that the battery 31 is in the degradation state, and the processing advances to step S108. Where the determination condition is not fulfilled in step S106, the processing advances to step S108. Thus, where it is determined whether or not the battery 31 shows a sign of degradation and the sign of degradation is determined to be present, erroneous determination can be prevented by further determining whether or not the battery 31 is in the degradation state.

Then, in step S108, the battery ECU 34 stores the representative voltage value of the battery 31 at the start of the vehicle 1 in the memory 34b located in the battery ECU 34.

The representative voltage value of the battery 31 at the start of the vehicle 1 is explained below. Referring to FIG. 3, as indicated hereinabove, the voltage value of the battery 31 typically changes by decreasing after the start operation, drifting at a certain decreased voltage value, and then returning to the original voltage value at the end of the start operation of the vehicle 1. With respect to such a change in the voltage value of the battery 31, the representative voltage value of the battery 31 at the start of the vehicle 1 means the representative value of the voltage value of the battery 31 at the start of the vehicle 1. For example, it may be the lowest voltage value of the battery 31 at the start of the vehicle 1, or the average value of the voltage values of the battery 31 at the start of the vehicle 1. The stored representative voltage value is used for determining, in the below-described step S110, whether or not the battery 31 at the start of the vehicle 1 is in the charging polarization state. The processing of step S108 may be performed in parallel with that of the above-described steps S102 to S107.

Then, in step S109, it is determined whether or not the SOC of the battery 31 at the start of the vehicle 1 has decreased. More specifically, the first degradation determination inhibition unit 34e of the battery ECU 34 determines whether or not the charging current value of the battery within a predetermined period of time after the battery has been started is continuously equal to or greater than a predetermined current value I1 for a third predetermined period of time (T3) or longer.

Figure 4:
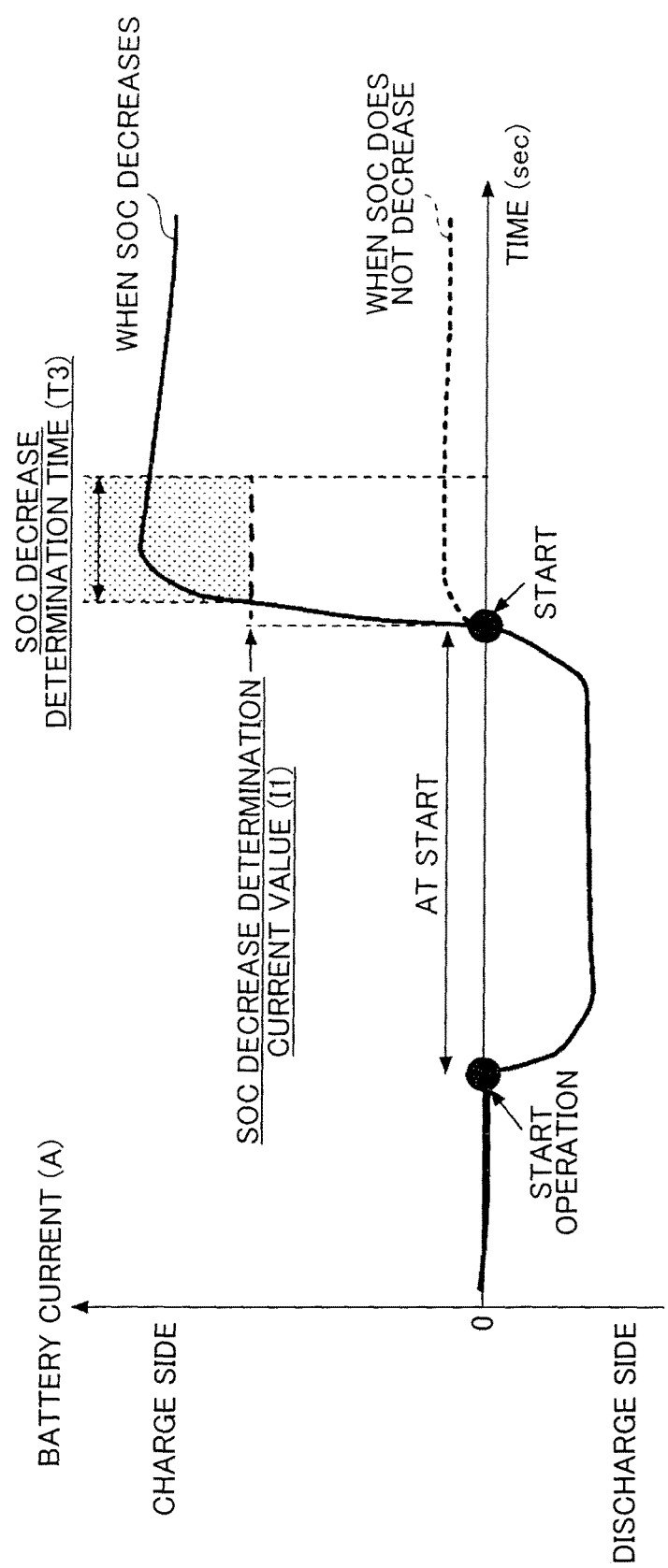
FIG. 4 explains a method for determining the decrease in SOC of the battery 31 with the battery degradation detection device 30 (battery ECU 34) of the present embodiment.

A method for determining whether or not the SOC of the battery 31 at the start of the vehicle 1 has decreased is explained below with reference to FIG. 4. FIG. 4 shows a change in the current value of the battery 31 at the start of the vehicle 1 and thereafter, the current value of the battery 31 being plotted on the ordinate, and time being plotted on the abscissa. The current value 0 on the ordinate is taken as a boundary, the zone thereabove represents the current value (charging current value) when the battery 31 is charged, and the zone therebelow represents the current value when the battery 31 is discharged.

Referring to FIG. 4, where the start operation of the vehicle 1 is performed, as indicated hereinabove, the supply of power from the battery 31 to the HVECU 40 is initiated, and the current energizing the HVECU 40 is discharged from the battery 31 at the start of the vehicle 1. Where the start operation of the vehicle 1 is completed, charging of the battery 31 is initiated by power supply from the HV battery 20 or the like through the DC-DC converter 21. Where the SOC of the battery 31 has not decreased, the charging current drifts at a comparatively small value, as shown by a dot line, for a predetermined period of time after the vehicle has been started. By contrast, where the SOC of the battery 31 has decreased, the charging current rises to a comparatively large value and drifts at this value, as shown by a solid line, for a predetermined period of time after the vehicle has been started. For this reason, I1 is set as a threshold current value determining whether or not the SOC of the battery 31 has decreased, and whether or not the SOC of the battery 31 has decreased is determined on the basis of I1. The charging current value after the start of the vehicle 1 can also change by temporarily becoming equal to or greater than I1 and then drifting at a value below I1, irrespective of the decrease in the SOC of the battery 31. For this reason, where the charging current value of the battery 31 in a predetermined period of time after the start of the vehicle 1 is continuously equal to or greater than I1 for T3 or longer, as shown in FIG. 4, it is determined that the SOC of the battery 31 at the start of the vehicle 1 has decreased. The decrease in the SOC of the battery 31 may be also determined in a simple manner by whether or not the charging current value of the battery 31 is equal to or greater than I1. A threshold current value I11 greater than I1 may be set and the decrease in the SOC of the battery 31 may be determined by whether or not the charging current value of the battery 31 is equal to or greater than I11 in order to prevent the detection of the case in which the charging current value of the battery 31 is temporarily equal to or greater than I1.

Figure 5:
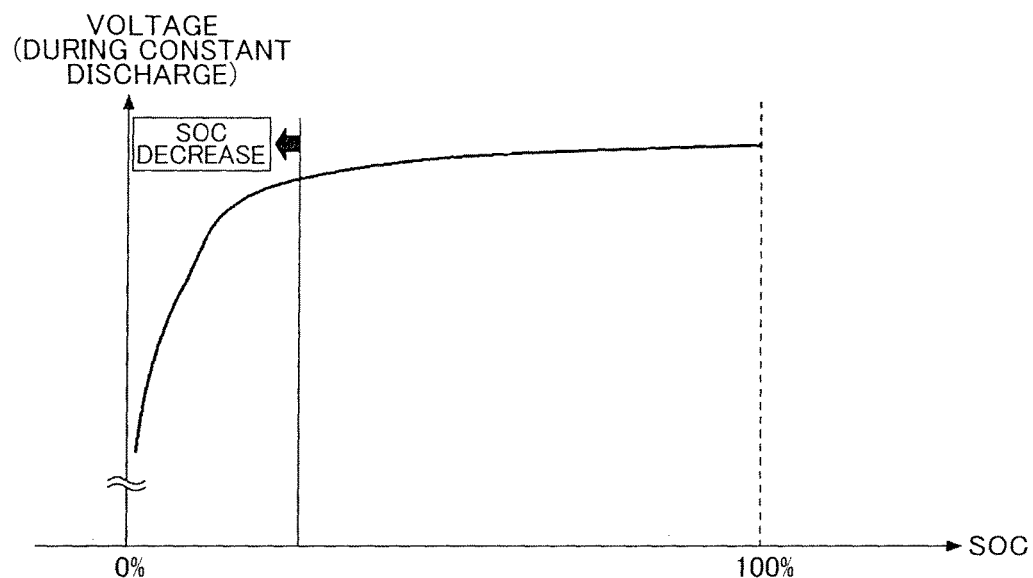
FIG. 5 explains the relationship between the voltage value and SOC of the battery 31.

The criteria for determining (the criteria for setting I1 and T3) whether or not the SOC has decreased are explained below. FIG. 5 shows an example of the relation between the voltage value (during constant discharge) and SOC of the battery 31. This figure shows how the voltage value changes in relation to the SOC of the battery 31; in the figure, the voltage value of the battery 31 is plotted against the ordinate, and the SOC of the battery 31 is plotted against the abscissa. The battery 31 demonstrates a substantially constant discharge even at the start of the vehicle 1, and the relationship shown in FIG. 5 fits with the voltage value of the battery 31 at the start of the vehicle 1.

Referring to FIG. 5, it is clear that the voltage value of the battery 31 has a very small variation rate till the SOC decreases from 100% to a certain value. However, the variation rate of the voltage value of the battery 31 starts gradually increasing when the SOC becomes below 50%, and where the SOC decreases to a comparatively low level, the voltage value of the battery 31 drops rapidly. It is thus clear that the voltage value of the battery 31 with a comparatively low SOC is substantially lower than that of the fully charged battery 31 (SOC is 100%). Accordingly, within the SOC range in the direction shown by the arrow in FIG. 5, the variation rate of the voltage value of the battery 31 is greater (than the predetermined variation rate that can be allowed for the voltage value in the fully charged battery) than that in the fully charged battery 31 (SOC is 100%), and it is possible to determine that the SOC of the battery 31 has decreased. In other words, the abovementioned I1 and T3 may be set such that the battery 31 with the SOC range in the direction shown by the arrow in FIG. 5 could be detected. Accordingly, as mentioned hereinabove, the sign-of-degradation predetermination or degradation predetermination of the battery 31 is performed in steps S102 to S107 on the basis of the correlation (correlation such that the voltage value decreases as the degradation advances) between the sign of degradation or degradation state of the battery 31 and the voltage value of the battery 31 at the start of the vehicle 1. However, where the SOC of the battery 31 is comparatively low, the voltage value can decrease greater than that in the fully charged battery. Therefore, the effect of the SOC of the battery 31 on the voltage value of the battery 31 at the start of the vehicle 1 increases. As a consequence, by setting I1 and T3 that enable the detection of the SOC range with a larger variation rate of the voltage value of the battery 31 than that in the case in which the battery 31 is fully charged, it can be determined whether or not there is a possibility that the aforementioned sign-of-degradation predetermination or degradation determination would not be performed with a good accuracy. The characteristic of the battery 31, such as shown in FIG. 5, at the start of the vehicle 1 is determined in advance by a test or the like, and the SOC range that should be detected can be set on the basis of the already determined characteristic of the battery 31. The characteristic of the charging current value after the start of the vehicle 1, which relates to the set SOC range, is also determined in advance by a test or the like. Therefore, I1 and T3 can be set on the basis of the already determined characteristic of the battery 31.

Where the determination criteria are fulfilled in step S109, the first degradation determination inhibition unit 34*e* inhibits the determination (predetermination as to whether or not the battery 31 shows a sign of degradation) by the sign-of-degradation determination unit 34*c* in the abovementioned steps S104 and S105. Likewise, the first degradation determination inhibition unit 34*e* inhibits the determination (predetermination as to whether or not the battery 31 is in the degradation state) by the degradation determination unit 34*d* in the above-describes steps S106 and S107. More specifically, the degradation detection processing of the battery 31 with respect to the present start of the vehicle 1, that is, the determination as to whether or not the battery 31 shows a sign of degradation and the determination as to whether or not the battery 31 is in the degradation state, is ended without confirmation (the processing returns to step S101). The inhibition of the determination performed by the sign-of-degradation determination unit 34*c* or the determination performed by the degradation determination unit 34*d* includes confirming the determination result obtained by the sign-of-degradation determination unit 34*c* and the determination result obtained by the degradation determination unit 34*d* as reference determination results, without ending the processing of the present flowchart. The display of the reference determination results on the display monitor 35 is also included in the below-described step S112.

When the determination criteria are not fulfilled in step S109, the processing advances to step S110.

Then, in step S110, it is determined whether or not the battery 31 at the start of the vehicle 1 is in the charging polarization state. More specifically, the second degradation determination inhibition unit 34*f* of the battery ECU 34 determines whether or not the representative voltage value of the battery 31 at the present start of the vehicle 1 is higher by a third predetermined voltage value (V3) or a greater value, than the average value of the record of the representative voltage values of the battery 31 at the third predetermined number (N3) of starts of the vehicle 1 up to the preceding time. Thus, it is determined whether or not a value obtained by subtracting the average value of the record of the representative voltage values of the battery 31 at the third predetermined number N3 of starts of the vehicle 1 up to the preceding time from the representative voltage value of the battery 31 at the present start of the vehicle 1 is equal to or greater than V3. As mentioned hereinabove, the representative voltage value of the battery 31 at the start of the vehicle 1 is stored in the memory 34*b* in step S108. Therefore, the representative voltage value of the battery 31 at the start of the vehicle 1 is stored as a record each time the vehicle 1 is started. Here, N3 is a natural value (excluding 0).

Figure 6:
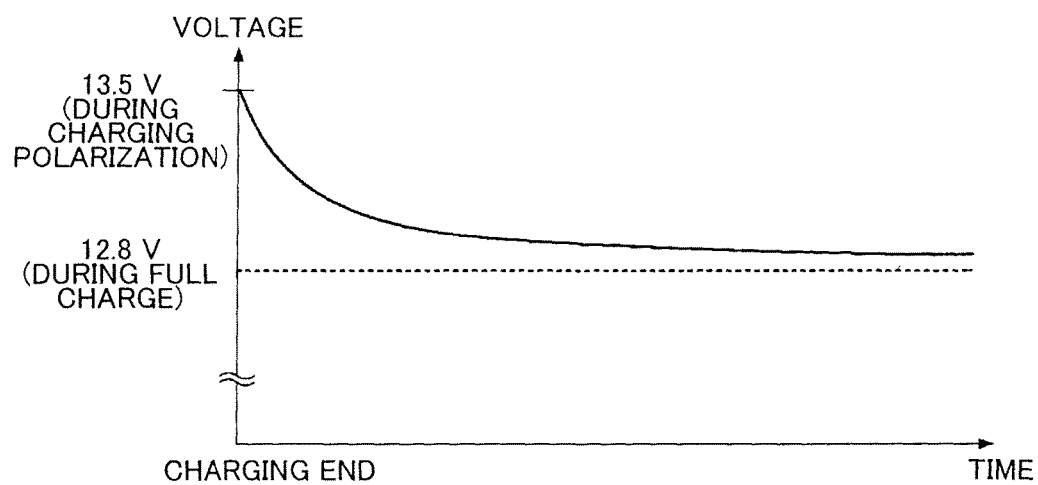
FIG. 6 explains changes in the voltage value of the battery 31 in relation to the time elapsed after charging.

The charging polarization state of the battery 31 is explained below with reference to FIG. 6. FIG. 6 explains changes in the voltage value of the battery 31 in relation to the time elapsed after the battery 31 has been charged. The case in which the fully charged state (SOC is 100%) is reached by charging is shown by way of example.

Referring to FIG. 6, immediately after the charging is ended, the battery 31 is in the charging polarization state and the voltage value of the battery 31 is about 13.5 V as compared with about 12.8 V which is the voltage value of the battery 31 at the time of the, usual full charging. The voltage value of the battery 31 then changes with passage of time so as to converge to 12.8 V. Thus, over a fixed period of time immediately after the battery 31 has been charged, the battery 31 demonstrates a voltage value which is higher than the usual voltage value due to the activation of chemical reactions inside the battery 31. This state is called the charging polarization state. A method for determining whether or not the battery 31 is in the charging polarization state is specifically explained below with reference to FIG. 7.

FIG. 7 explains a method for determining the charging polarization of the battery 31 with the battery degradation detection device 30 (battery ECU 34) of the present embodiment. In the table shown in FIG. 7, the number of times the vehicle 1 has been started is shown in the first row, the representative voltage value at the start of the vehicle 1 corresponding to each number of times the vehicle 1 has been started is shown in the second row, and the recorded average value of the representative voltage values of the battery 31 taken over the past N3 times the vehicle 1 has been started before each number of times the vehicle 1 has been started is shown in the third row. For the sake of convenience, the number of times the vehicle 1 has been started is shown as a negative value, since the number of times is counted for the past events.

Referring to FIG. 7, the representative voltage value of the battery 31 at the start of the vehicle 1, which has been stored in the memory 34*b* in step S108, is shown as a record in the second row of the table correspondingly to each number of starts. The average value of the record of the representative voltage values of the battery 31 at the past N3 starts of the vehicle 1 preceding each number of starts is calculated on the basis of this record and is shown in the third row of the table. As mentioned hereinabove, when the battery 31 is in the charging polarization state, the battery 31 shows the voltage value which is higher than usual. From the statistical standpoint, as the number of past starts increases, the average value of the record of the representative voltage values of the battery 31 at the start of the vehicle 1 can be taken as the representative voltage value of the battery 31 which is not in the charging polarization state. Therefore, whether or not the battery 31 at the start of the vehicle 1 is in the charging polarization state can be determined by comparing the representative voltage value of the battery 31 at the present start of the vehicle 1 with the average value of the record of the representative voltage values of the battery 31 at the past starts of the vehicle 1. In other words, where the aforementioned V3 is set as a threshold voltage value and the representative voltage value of the battery 31 at the present start of the vehicle 1 is higher by V3, or a greater value, than the average value of the record of the representative voltage values of the battery 31 at the N3 starts of the vehicle 1 up to the preceding time, the battery 31 at the start of the vehicle 1 can be determined to be in the charging polarization state. For example, in FIG. 7, the representative voltage value of the battery 31 at the present start of the vehicle 1 is 10.5 V, and the average value of the record of the representative voltage values of the battery 31 at the past N3 starts of the vehicle 1 up to the preceding time is 9.7 V. For example, where V3 is taken as 0.5 V, the representative voltage value of the battery 31 at the present start of the vehicle 1 is higher by 0.8 V than 9.7 V, which is the average value of the record of the representative voltage values of the battery 31 at the past N3 starts of the vehicle 1 up to the preceding time. Therefore, it is determined that the battery 31 at the present start of the vehicle 1 is in the charging polarization state.

In the present embodiment, the average value of the record of the representative voltage values of the battery 31 at the past N3 starts of the vehicle 1 up to the preceding time is used, but an average value of the entire past record may be also used. Further, it is more preferred that the average value of the record corresponding to the case in which the battery 31 has been determined in step S110 not to be in the charging polarization state be used, from the record of the representative voltage values of the battery 31 at the starts of the vehicle 1 up to the preceding time. Further, whether or not the battery 31 at the start of the vehicle 1 is in the charging polarization state may be also determined by comparing the most recent record corresponding to the case in which the battery 31 has been determined in step S110 not to be in the charging polarization state, from the record of the representative voltage values of the battery 31 at the starts of the vehicle 1 up to the preceding time, with the representative voltage value of the battery 31 at the present start of the vehicle 1.

As mentioned hereinabove, in steps S102 to S107, the sign-of-degradation predetermination or degradation state predetermination of the battery 31 is performed on the basis of the correlation between the sign of degradation or degradation state of the battery 31 and the voltage value of the battery 31 at the start of the vehicle 1 (the correlation such that the voltage value decreases as the degradation advances). However, when the battery 31 at the start of the vehicle 1 is in the charging polarization state, the voltage value of the battery 31 is higher than in the case in which the battery is not in the charging polarization state, as has been mentioned hereinabove. Therefore, the effect of charging polarization on the voltage value of the battery 31 at the start of the vehicle 1 increases. As a result, by determining whether or not the battery 31 at the start of the vehicle 1 is in the charging polarization state, it is possible to determine whether or not the aforementioned sign-of-degradation determination or degradation determination may not be performed with a good accuracy.

Where the determination criteria are fulfilled in step S110, the second degradation determination inhibition unit 34*f* inhibits the determination performed by the sign-of-degradation determination unit 34*c* in the above-described steps S104 and S105 (predetermination as to whether or not the battery 31 shows a sign of degradation). Likewise, the second degradation determination inhibition unit 34*f* inhibits the determination performed by the degradation determination unit 34*d* in the above-described steps S106 and S107 (predetermination as to whether or not the battery 31 is in the degradation state). More specifically, the degradation detection processing of the battery 31 with respect to the present start of the vehicle 1, that is, the determination as to whether or not the battery 31 shows a sign of degradation and the determination as to whether or not the battery 31 is in the degradation state, is ended without confirmation (the processing returns to step S101). The inhibition of the determination performed by the sign-of-degradation determination unit 34*c* or the determination performed by the degradation determination unit 34*d* includes confirming the determination result obtained by the sign-of-degradation determination unit 34*c* and the determination result obtained by the degradation determination unit 34*d* as reference determination results, without ending the processing of the present flowchart. The display of the reference determination results on the display monitor 35 in the below-described step S112 is also included.

When the determination criteria are not fulfilled in step S110, the processing advances to step S111.

Then, in step S111, the sign-of-degradation predetermination in step S105 is confirmed as the sign-of-degradation determination. Thus, the determination that the battery 31 shows a sign of degradation is confirmed. Further, the degradation predetermination in step S107 is confirmed as the degradation determination. Thus, the determination that the battery 31 is in the degradation state is confirmed. This is because the case in which it is possible that the sign-of-degradation determination or degradation determination would not be performed with a good accuracy, that is, the case in which the SOC of the battery 31 at the start of the vehicle 1 has decreased and the case in which the battery 31 at the start of the vehicle 1 is in the charging polarization state, are not realized.

Then, in step S112, the sign-of-degradation determination result and degradation determination result are displayed on the display monitor 35 and a warning is issued. The warning display may display both the sign-of-degradation determination result and the degradation determination result, or may display either of the results. With respect to the sign-of-degradation determination result, the warning display may be performed only when it is determined that the battery 31 shows a sign of degradation, and notification display may be performed when it is determined that the battery shows no sign of degradation. Likewise, with respect to the degradation determination result, the warning display may be performed only when it is determined that the battery 31 is in the degradation state, and notification display may be performed when it is determined that the battery is not in the degradation state.

The above-described battery degradation detection processing shown in FIG. 2A and FIG. 2B are performed repeatedly each time the vehicle 1 is started.

The operation of the battery degradation detection device 30 according to the present embodiment is explained below., The battery degradation detection device 30 (flag setting unit 34*a,* flag storage unit 34*b*) according to the present embodiment sets and stores the sign-of-degradation flag of the battery 31 on the basis of the voltage value of the battery 31 at the start of the vehicle 1 each time the vehicle 1 is started. Further, the battery degradation detection device 30 (sign-of-degradation determination unit 34*c*) also determines whether or not the battery 31 shows a sign of degradation on the basis of the number of times the sign-of-degradation flag has been stored in the past. More specifically, the sign-of-degradation determination unit 34*c* determines that the battery 31 shows a sign of degradation when the number of times the sign-of-degradation flag has been stored is equal to or greater than N2, from N1 starts preceding the present start of the vehicle 1. As a result, the presence of a sign of degradation is determined on the basis of not only the detection of the sign of degradation associated with the present start of the vehicle 1, but also on the basis of the number of times (a plurality of times) the sign-of-degradation flag has been stored in the past. Therefore, the erroneous determination, for example, in the case where a sign of degradation is accidentally detected for some reason or other, can be prevented.

Further, the battery degradation detection device 30 (degradation determination unit 34*d*) also determines whether or not the battery 31 is in the degradation state on the basis of the voltage value of the battery 31 at the start of the vehicle 1 when it has been determined by the sign-of-degradation determination unit 34c that the battery 31 shows a sign of degradation. More specifically, it is determined that the battery 31 is in the state of degradation where the battery 31 is determined by the sign-of-degradation determination unit 34c to show a sign of degradation and the voltage value of the battery 31 at the start of the vehicle 1 is continuously less than V2, which is lower than V1, for the second predetermined period of time T2 or longer. As a result, the degradation determination is performed after the sign-of-degradation determination has been performed, and therefore the erroneous determination can be prevented.

Further, the battery degradation detection device 30 (first degradation determination prohibition unit 34e) also determines whether or not to inhibit the determination, which is performed by the degradation determination unit, on the basis of the charging current value of the battery 31 in a predetermined period of time after the start of the vehicle 1. More specifically, the determination performed by the sign-of-degradation determination unit 34c and the degradation determination unit 34d is inhibited when the charging current value of the battery 31 in a predetermined period of time after the start of the vehicle 1 is continuously equal to or higher than I1 for the third predetermined period of time T3 or longer. As a result, the case in which it is possible that the sign-of-degradation determination or degradation determination would not be performed with a good accuracy, that is, the case in which the SOC of the battery 31 at the start of the vehicle 1 has decreased, can be detected. In this case, the erroneous determination can be also avoided by inhibiting the sign-of-degradation determination or degradation determination. Furthermore, it is possible to avoid performing the determination, for example, as to whether or not to replace a battery 31, on the basis of the determination with questionable accuracy.

Further, the battery degradation detection device 30 (first degradation determination prohibition unit 34e) also detects the case in which the SOC of the battery 31 at the start of the vehicle 1 has decreased on the basis of the charging current value of the battery 31 in a predetermined period of time after the start of the vehicle 1. As a result, it is not necessary to use a sensor or the like for directly detecting the SOC of the battery 31. Therefore, the increase in mass and cost of the vehicle 1 can be inhibited.

Further, the battery degradation detection device 30 (second degradation determination prohibition unit 34f) also determines whether or not to inhibit the determination performed by the sign-of-degradation determination unit 34c and the degradation determination unit 34d on the basis of the representative voltage value of the battery 31 at the present start of the vehicle 1 and the record of the representative voltage values of the battery 31 at the starts of the vehicle 1 up to the preceding time. More specifically, the determination performed by the sign-of-degradation determination unit 34c and the degradation determination unit 34d is inhibited where a value obtained by subtracting the average value of record up to the preceding time from the representative voltage value of the battery 31 at the present start of the vehicle 1 is equal to or greater than V3. As a result, the case in which it is possible that the sign-of-degradation determination or degradation determination would not be performed with a good accuracy, that is, the case in which the battery 31 at the start of the vehicle 1 is in the charging polarization state, can be detected. In this case, the erroneous determination can be also avoided by inhibiting the sign-of-degradation determination or degradation determination. Furthermore, it is possible to avoid performing the determination, for example, as to whether or not to replace the battery 31, on the basis of the determination with questionable accuracy. It is more preferred that the average value be an average value of a record, from the records, relating to the case in which the second degradation determination inhibition unit 34f has determined not to inhibit the determination. As a result, the case in which the battery 31 at the start of the vehicle 1 is in the charging polarization state can be detected with a higher accuracy.

Further, the battery degradation detection device 30 (second degradation determination prohibition unit 34f) also detects the case in which the battery 31 at the start of the vehicle 1 is in the charging polarization state on the basis of the representative voltage value of the battery 31 at the present start of the vehicle and the representative voltage values of the battery 31 at the starts of the vehicle 1 up to the preceding time. As a result, the charging polarization state of the battery 31 can be detected without providing a device for monitoring the voltage after the vehicle 1 has been stopped (the so-called "ignition-OFF"), or measuring with a timer or the like the time elapsed since the vehicle 1 has been stopped. Therefore, the increase in mass and cost of the vehicle 1 can be inhibited. Further, since the amount of discharge in the stopping state of the vehicle 1 can be inhibited, the occurrence of problems such as the exhaustion of the battery 31 can be prevented.

Further, the battery degradation detection device 30 (display monitor 35) also warns an occupant of the vehicle 1 that the battery 31 shows a sign of degradation when it is determined by the sign-of-degradation determination unit 34c that the battery 31 shows a sign of degradation. The occupant of the vehicle 1 is also warned that the battery 31 is in the degradation state when it is determined by the degradation determination unit 34d that the battery 31 is in the degradation state. As a result, the driver or the like of the vehicle 1 can be advised to, for example, replace the battery 31.

The battery degradation detection device 30 also determines whether or not the SOC of the battery 31 at the start of the vehicle 1 has decreased and determines whether or not the battery 31 at the start of the vehicle 1 is in the charging polarization state after the sign-of-degradation predetermination and degradation predetermination of the battery 31 have been performed. As a result, for example, it is possible to perform the sign-of-degradation predetermination and degradation determination at the start of the vehicle 1 and also determine, after the start of the vehicle 1, whether or not the SOC of the battery 31 at the start of the vehicle 1 has decreased and whether or not the battery 31 at the start of the vehicle 1 is in the charging polarization state. Therefore, the processing can be performed efficiently.

The embodiment of the invention are described hereinabove in detail, but the invention is not limited to the specific embodiment and can be variously changed and modified without departing from the scope of the invention defined by the appended claims.

Figure 8A:
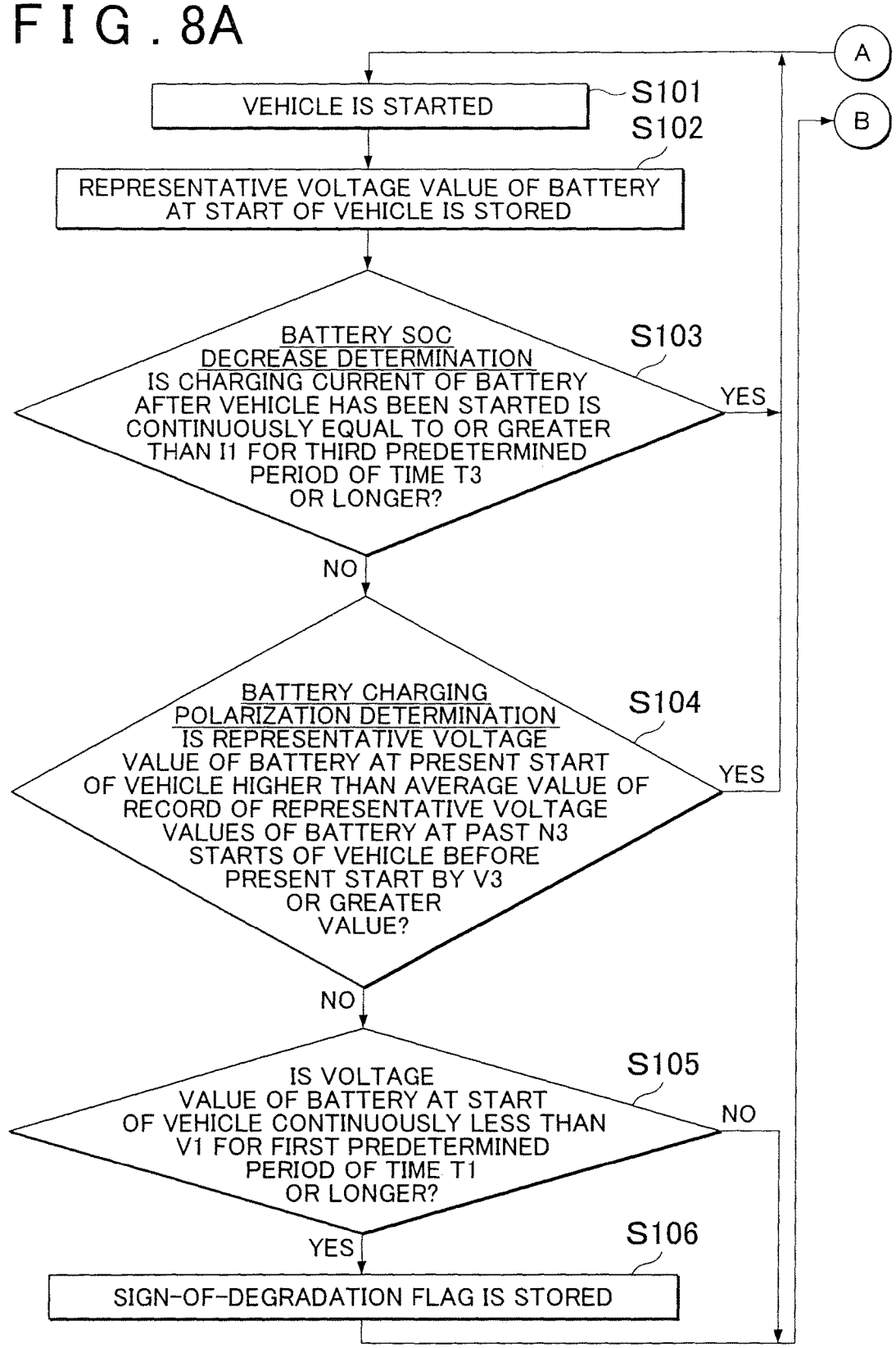
FIG. 8A and FIG. 8B are flowcharts of battery degradation detection processing according to a variation example of the battery degradation detection device 30 of the present embodiment.
Figure 8B:
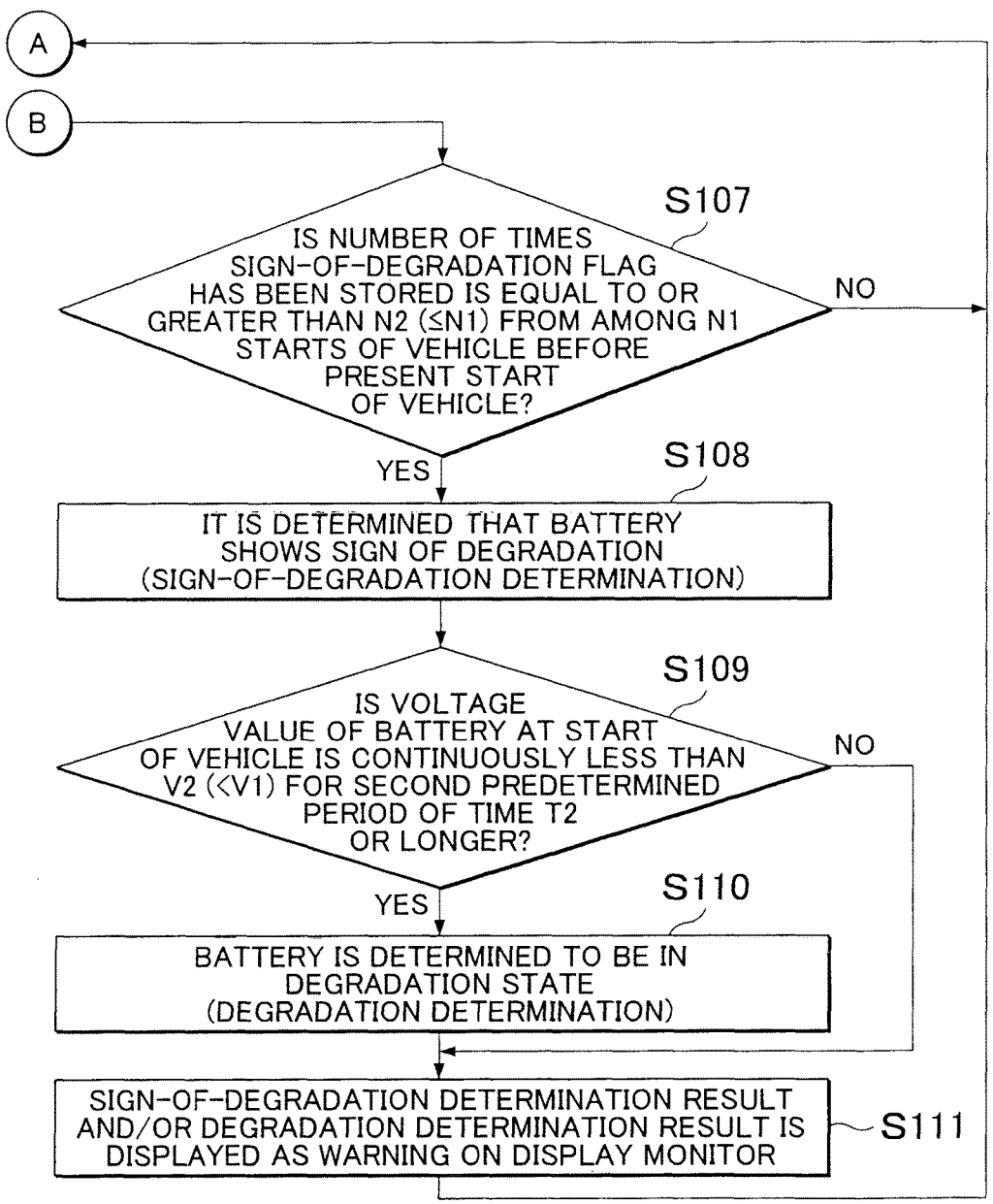

For example, FIG. 8A and FIG. 8B are flowcharts of battery degradation detection processing according to a variation example of the battery degradation detection device 30 of the above-described embodiment.

Referring to FIG. 8A and FIG. 8B, in the flowchart of battery degradation detection processing of the variation example, the steps of the battery degradation detection processing shown in FIG. 2A and FIG. 2B and relating to the above-described embodiment are reshuffled. More specifically, in FIG. 2A and FIG. 2B, the sign-of-degradation pre-determination and degradation pre-determination are performed in steps S103 and S105; respectively. Then, in step S109, it is determined whether or not the SOC of the battery 31 at the start of the vehicle 1 has decreased, and in step S110, it is determined whether or not the battery 31 at the start of the vehicle 1 is in the charging polarization state. By contrast, in FIG. 8A and FIG. 8B, it is determined whether or not the SOC of the battery 31 at the start of the vehicle 1 has decreased and it is determined whether or not the battery 31 at the start of the vehicle 1 is in the charging polarization state in steps S103 and S104, respectively. Then, the sign-of-degradation pre-determination and degradation pre-determination are performed in steps S108 and S110.

In the variation example, where the determination criteria are fulfilled in step S103, that is, where it is determined that the SOC of the battery 31 at the start of the vehicle 1 has decreased, the determination performed by the sign-of-degradation determination unit 34c and the degradation determination unit 34d is inhibited. Likewise, where the determination criteria are fulfilled in step S104, that is, where it is determined that the battery 31 at the start of the vehicle 1 is in the charging polarization state, the determination performed by the sign-of-degradation determination unit 34c and the degradation determination unit 34d is inhibited. More specifically, both in step S103 and in step S104, where the determination criteria are fulfilled, the sign-of-degradation determination by the sign-of-degradation determination unit 34c and the degradation determination by the degradation determination unit 34d are not performed (the processing returns to step S101). In the same manner as in the above-described embodiment, the inhibition of the determination performed by the sign-of-degradation determination unit 34c and the degradation determination unit 34d includes performing the determination by the sign-of-degradation determination unit 34c and the degradation determination unit 34d and taking the determination results as reference determination results, without ending the processing of the present flowchart. The display of the reference determination results on the display monitor 35 is also included in step S111.

The operation and effects demonstrated in the variation example are same as those of the battery degradation detection device 30 according to the above-described embodiment.

Further, in the above-described embodiment, the vehicle 1 is a hybrid vehicle, but it may be any vehicle, for example, an electric automobile, a fuel cell vehicle, and an engine vehicle (a vehicle using only an engine as a power source). For example, in the case of the engine vehicle, the degradation detection processing of the battery 31 by the battery degradation detection device 30, may be performed under an assumption that the start of the vehicle 1 is the start of the engine 10 and that the battery 31 is charged by power supply from an alternator. Further, in the case of the engine vehicle, when the vehicle 1 is started (the engine 10 is started), the electric power is supplied from the battery 31 to the starter of the engine 10, thereby decreasing the voltage value of the battery 31. Furthermore, where an engine vehicle has an idling stop function, the degradation detection processing of the battery 31 by the above-described battery degradation detection device 30 may be performed with respect to a restart after an idling stop.

Further, in the above-described embodiment, the battery degradation detection device 30 issues a warning by displaying on the display monitor 35 the determination result or the like of the degradation determination unit 34d that indicates that the battery 31 is in a degradation state, but the warning may be also issued by other methods. For example, the battery degradation detection device 30 may include a speaker, and a sound signal corresponding to the determination result of the degradation determination unit 34d that indicates that the battery 31 is in a degradation state may be inputted to the speaker to issue a sound warning. A warning or the like may be also issued by a combination of image display on the display monitor 35 and a sound output from the speaker.

The invention claimed is:

1. A battery degradation detection device that detects a degradation state of a battery installed on a vehicle, the battery degradation detection device comprising:
    a flag setting unit that, for each vehicle start, sets a flag indicating a sign of degradation of the battery only when a voltage value of the battery at a start of the vehicle is continuously less than a first predetermined voltage value for a first predetermined period of time or longer;
    a flag storage unit that stores the flag;
    a sign-of-degradation determination unit that determines whether or not the battery shows a sign of degradation on the basis of the number of times the flag has been stored in the past; and
    a degradation determination unit that determines whether or not the battery is in a degradation state after it is determined by the sign-of-degradation determination unit that the battery shows a sign of degradation, wherein the degradation determination unit determines the battery is in the degradation state when the voltage value of the battery is continuously less than a second predetermined voltage value, which is less than the first predetermined voltage value, for a second predetermined period of time or longer; and
    a display unit that displays a warning of at least one of the sign-of-degradation determination result or the degradation determination result.

2. The battery degradation detection device according to claim 1, wherein
    the sign-of-degradation determination unit determines that the battery shows a sign of degradation when the number of times the flag has been stored is equal to or greater than a second predetermined number, from among a first predetermined number of times the vehicle has been started before a present start of the vehicle.

3. The battery degradation detection device according to claim 1, further comprising:
    a first degradation determination inhibition unit configured to determine whether or not to inhibit the determination, which is performed by the degradation determination unit, on the basis of a charging current value of the battery in a predetermined period of time after the vehicle has been started.

4. The battery degradation detection device according to claim 3, wherein
    the first degradation determination inhibition unit determines to inhibit the determination, which is performed by the degradation determination unit, when the charging current value is continuously equal to or greater than a predetermined current value for a third predetermined period of time or longer.

5. The battery degradation detection device according to claim 3, further comprising:
    a second degradation determination inhibition unit configured to determine whether or not to inhibit the determination, which is performed by the degradation determination unit, on the basis of a representative voltage value of the battery at a present start of the vehicle and a record of representative voltage values of the battery at the starts of the vehicle up to a preceding time, when the first degradation determination inhibition unit determines not to inhibit the determination performed by the degradation determination unit.

6. The battery degradation detection device according to claim 5, wherein
the second degradation determination inhibition unit determines to inhibit the determination, which is performed by the degradation determination unit, when a value obtained by subtracting an average vehicle starting voltage value of the record from the representative voltage value of the battery at the present start of the vehicle is equal to or greater than a third predetermined voltage value.

7. The battery degradation detection device according to claim 6, wherein
the average vehicle starting voltage value is an average vehicle starting voltage value of a record, from among the records, relating to a case in which the second degradation determination inhibition unit has determined not to inhibit the determination.

8. The battery degradation detection device according to claim 1, further comprising:
a warning unit configured to warn an occupant of the vehicle that the battery is in a degradation state when the battery is determined by the degradation determination unit to be in the degradation state.

* * * * *